(12) United States Patent
Yeh

(10) Patent No.: US 11,948,852 B2
(45) Date of Patent: Apr. 2, 2024

(54) SEMICONDUCTOR DEVICE PACKAGE

(71) Applicant: Advanced Semiconductor Engineering, Inc., Kaohsiung (TW)

(72) Inventor: Chang-Lin Yeh, Kaohsiung (TW)

(73) Assignee: ADVANCED SEMICONDUTOR ENGINEERING, INC., Kaohsiung (TW)

(*) Notice: Subject to any disclaimer, the term of this patent is extended or adjusted under 35 U.S.C. 154(b) by 75 days.

(21) Appl. No.: 17/239,483

(22) Filed: Apr. 23, 2021

(65) Prior Publication Data

US 2022/0344234 A1 Oct. 27, 2022

(51) Int. Cl.
| | |
|---|---|
| *H01L 23/367* | (2006.01) |
| *H01L 21/48* | (2006.01) |
| *H01L 21/56* | (2006.01) |
| *H01L 23/00* | (2006.01) |
| *H01L 23/31* | (2006.01) |
| *H01L 23/498* | (2006.01) |
| *H01L 23/538* | (2006.01) |

(52) U.S. Cl.
CPC ........ *H01L 23/367* (2013.01); *H01L 21/4846* (2013.01); *H01L 21/56* (2013.01); *H01L 23/3128* (2013.01); *H01L 23/49816* (2013.01); *H01L 23/49833* (2013.01); *H01L 23/5385* (2013.01); *H01L 23/5386* (2013.01); *H01L 24/16* (2013.01); *H01L 2224/16227* (2013.01); *H01L 2224/16237* (2013.01)

(58) Field of Classification Search
CPC .................... H01L 23/49833; H01L 23/5385; H01L 24/16
See application file for complete search history.

(56) References Cited

U.S. PATENT DOCUMENTS

| | | | |
|---|---|---|---|
| 7,863,755 B2 | 1/2011 | Lee et al. | |
| 8,080,445 B1* | 12/2011 | Pagaila | H01L 23/5389 438/455 |
| 2004/0212051 A1* | 10/2004 | Zhao | H01L 23/49833 257/E23.092 |
| 2008/0144180 A1* | 6/2008 | Nishida | H01J 11/12 359/601 |
| 2011/0074028 A1* | 3/2011 | Pendse | H01L 24/32 257/E21.705 |
| 2021/0134690 A1* | 5/2021 | Chen | H01L 23/16 |
| 2021/0265311 A1* | 8/2021 | Lu | H01L 21/56 |
| 2022/0344230 A1* | 10/2022 | Chang | H01L 23/3128 |

* cited by examiner

Primary Examiner — Nicholas J Tobergte
(74) Attorney, Agent, or Firm — FOLEY & LARDNER LLP

(57) ABSTRACT

The present disclosure provides a semiconductor device package including a first substrate, a second substrate disposed over the first substrate, an electronic component disposed between the first substrate and the second substrate, a spacer disposed between the first substrate and the electronic component, and a supporting element disposed on the first substrate and configured to support the second substrate. The spacer is configured to control a distance between the first substrate and the second substrate through the electronic component. A method of manufacturing a semiconductor device package is also disclosed.

14 Claims, 15 Drawing Sheets

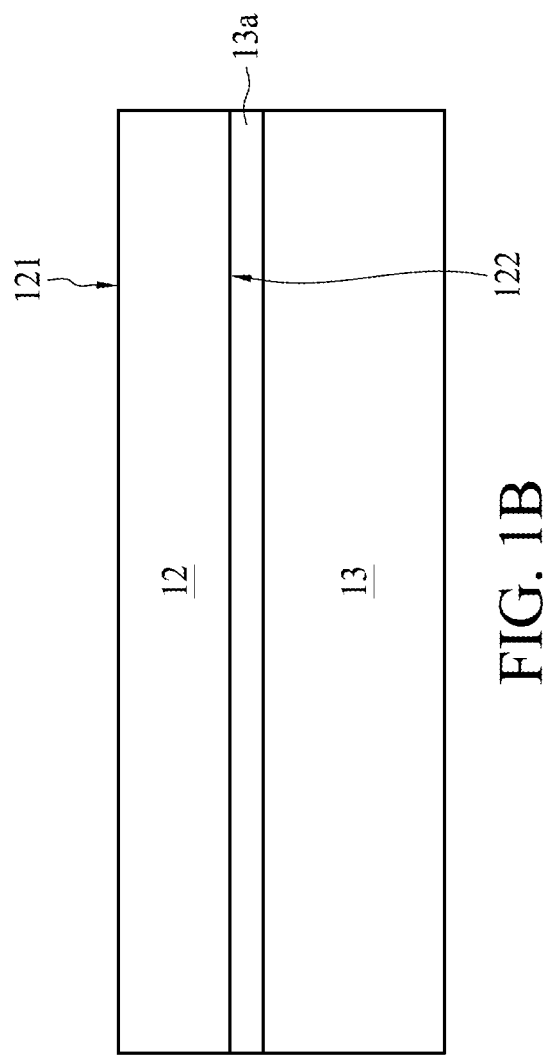

SEMICONDUCTOR DEVICE PACKAGE

BACKGROUND

1. Technical Field

The present disclosure relates to a semiconductor device package including a thermal conductive structure and a method of manufacturing the same.

2. Description of the Related Art

As the requirement of the performance and the functionality of a semiconductor device package increases, more electronic components are integrated within a single semiconductor device package. In order to increase package density and to reduce package size, a dual-side assembly may be employed. That is, the electronic components may be mounted on both surfaces of a substrate or a carrier. However, the problem of heat dissipation may become severe if more components are integrated into the package. Thus, it can be useful in some implementations to provide a semiconductor device package with improved thermal conductivity.

In addition, interconnection structures are commonly attached or bonded to pads on a substrate through connection elements (e.g., solder). Warpage may occur during reflow, resulting in an uneven joint height or problems such as non-wetting or insufficient solder.

SUMMARY

In some embodiments, a semiconductor package device includes a first substrate, a second substrate disposed over the first substrate, an electronic component disposed between the first substrate and the second substrate, a spacer disposed between the first substrate and the electronic component, and a supporting element disposed on the first substrate and configured to support the second substrate. The spacer is configured to control a distance between the first substrate and the second substrate through the electronic component.

In some embodiments, a semiconductor package device includes a first substrate, a second substrate disposed over the first substrate, an electronic component disposed between the first substrate and the second substrate, and a thermal conductive structure disposed between the first substrate and the electronic component. The semiconductor package device also includes a soldering material electrically connecting with the first substrate and the second substrate.

In some embodiments, a method of manufacturing a semiconductor package device includes providing a first structure including a first substrate and an electronic component; providing a second structure including a second substrate and a spacer, and bonding the first structure to second structure by connecting the electronic component to the spacer.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

FIG. 1B illustrates a cross-sectional view of a portion of a semiconductor device package in accordance with some embodiments of the present disclosure.

DETAILED DESCRIPTION

Figure 1A:
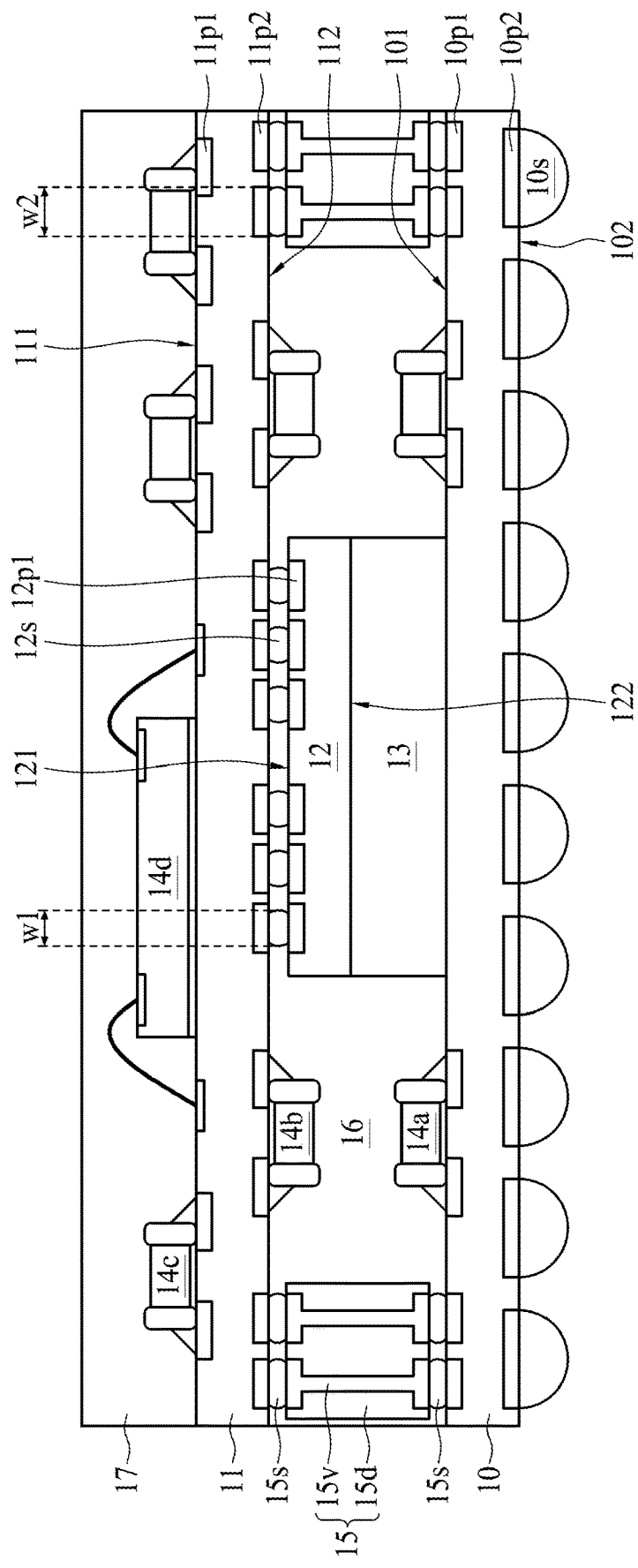
FIG. 1A illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

The following description includes description of some semiconductor device packages, and methods of manufacturing thereof.

FIG. 1A illustrates a cross-sectional view of a semiconductor device package 1 in accordance with some embodiments of the present disclosure. As shown in FIG. 1, the semiconductor device package 1 includes substrates 10, 11, electronic components 12, 14a, 14b, 14c, 14d, a thermal conductive structure 13, an interconnection structure 15, and encapsulants 16, 17.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. In some embodiments, the substrate 10 may be a single-layer substrate or multi-layer substrate which includes a core layer and a conductive material and/or structure disposed on a surface 101 (also can be referred to as a top surface or a first surface) and a surface 102 (also can be referred to as a bottom surface or a second surface) of the substrate 10. The conductive material and/or structure may include a plurality of traces. The substrate 10 may include one or more conductive pads 10p1 in proximity to, adjacent to, or embedded in and exposed at the surface 101 of the substrate 10. The substrate 10 may include one or more conductive pads 10p2 in proximity to, adjacent to, or embedded in and exposed at the surface 102 of the substrate 10. The substrate 10 may include solder resists (or solder mask) (not illustrated in the figures) respectively on the surfaces 101 and 102 of the substrate 10 to fully expose or to expose at least a portion of the conductive pads 10p1 and 10p2 for electrical connections. One or more electrical contacts (e.g., solder balls 10s) may be disposed on the surface 102 of the substrate 10 and electrically connected to the conductive pads 10p2 of the substrate 10.

The substrate 11 is disposed over the surface 101 of the substrate 10. In some embodiments, the substrate 11 and the substrate 10 may include the same material. Alternatively, the substrate 11 and the substrate 10 may include different materials. The substrate 11 may include one or more conductive pads 11p1 in proximity to, adjacent to, or embedded in and exposed at a surface 111 (also can be referred to as a top surface or a first surface) of the substrate 11. The substrate 11 may include one or more conductive pads 11p2 in proximity to, adjacent to, or embedded in and exposed at a surface 112 (also can be referred to as a bottom surface or a second surface) of the substrate 11. The substrate 11 may include solder resists (or solder mask) (not illustrated in the figures) respectively on the surfaces 111 and 112 of the substrate 11 to fully expose or to expose at least a portion of the conductive pads 11p1 and 11p2 for electrical connections.

The electronic component 14a is disposed on the surface 101 of the substrate 10 and electrically connected to the substrate 10 (e.g., to the conductive pads 10p1). The electronic components 12 and 14b are disposed on the surface 112 of the substrate 11 and electrically connected to the substrate 11 (e.g., to the conductive pads 11p2). The electronic components 14c and 14d are disposed on the surface 111 of the substrate 11 and electrically connected to the substrate 11 (e.g., to the conductive pads 11p1).

Each of the electronic components 12, 14a, 14b, 14c, and 14d may include an active electrical component and/or a passive electrical component. For example, each of the electronic components 12, 14a, 14b, 14c, and 14d may be a chip or a die including a semiconductor substrate, one or more integrated circuit devices and one or more overlying interconnection structures therein. For example, each of the electronic components 12, 14a, 14b, 14c, and 14d may be a passive electrical component, such as a capacitor, a resistor, or an inductor. The electronic component 14c or 14d may be electrically connected to one or more of other electronic components and to the surface 111 of the substrate 11 (e.g., to the RDL), and electrical connection may be attained by way of flip-chip or wire-bond techniques. The electronic component 12 or 14b may be electrically connected to one or more of other electronic components and to the surface 112 of the substrate 11 (e.g., to the RDL), and electrical connection may be attained by way of flip-chip or wire-bond techniques. In some embodiments, the electronic component 12 may be electrically connected to the substrate 11 through solder balls 12s. In some embodiments, the electronic component 12 may be physically disconnected from the substrate 10. For example, the electronic component 12 may be spaced apart from the substrate 10. For example, the electronic component 12 may be not in contact with the substrate 10. The electronic component 14a may be electrically connected to one or more of other electronic components and to the surface 101 of the substrate 10 (e.g., to the RDL), and electrical connection may be attained by way of flip-chip or wire-bond techniques. In some embodiments, there may be any number of the electronic components 12, 14a, 14b, 14c, and 14d depending on different design specifications. In some embodiments, the electronic components 12, 14a, 14b, 14c, 14d can be arranged based on their dimensions (such as widths, thicknesses, or areas) to further reduce the package size of the semiconductor device package 1.

The interconnection structure 15 (which can also be referred to as a supporting element) is disposed between the substrates 10 and 11, and electrically connected to the substrates 10 and 11. In some embodiments, the interconnection structure 15 may support the substrate 11 over the substrate 10. In some embodiments, the interconnection structure 15 may be or may include an interposer. For example, the interposer may include a dielectric layer 15d and at least one via 15v penetrating the dielectric layer 15d for electrical connection. The exposed portions of the via 15v may be electrically connected to the substrate 10 (e.g., to the conductive pad 10p1) and the substrate 11 (e.g., to the conductive pad 11p2) through a soldering material, such as solder balls 15s. In some embodiments, there may be any number of the interposers depending on different design specifications. The interposers may be disposed in or near the periphery or any other locations of the substrate 10 or substrate 11.

In some embodiments, the substrate 10 and the substrate 11 may be electrically connected through at least two kinds of conductive materials, such as copper and soldering material. For example, the current from the substrate 10 may flow to the substrate 11 through the conductive pad 10p1, the solder ball 15s on the conductive pad 10p1, the via 15v, the solder ball 15s on the via 15v, and the conductive pad 11p2. For example, at least two kinds of conductive materials are connected between the substrate 10 and the substrate 11 in the stacking direction between the substrate 10 and the substrate 11. For example, at least two kinds of conductive materials are connected between the surface 101 of the substrate 10 and the surface 112 of the substrate 11.

In some embodiments, the solder ball 15s and the solder ball 12s may include the same material. Alternatively, the solder ball 15s and the solder ball 12s may include different materials. In some embodiments, the solder ball 15s and the solder ball 12s may include the same reflow temperature. Alternatively, the solder ball 15s and the solder ball 12s may include different reflow temperatures. For example, the reflow temperature of the solder ball 12s may be greater than the reflow temperature of the solder ball 15s.

In some embodiments, the solder ball 15s and the solder ball 12s may include the same dimension (such as a width or a height). Alternatively, the solder ball 15s and the solder ball 12s may include different dimensions. For example, the solder ball 15s may have a dimension (such as a width or a height) w2 greater than a dimension (such as a width or a height) w1 of the solder ball 12s.

The encapsulant 16 is disposed between the substrate 10 and the substrate 11 to cover or encapsulate the interconnection structure 15, the thermal conductive structure 13 and the electronic components 12, 14a, and 14b. In some embodiments, the encapsulant 16 includes an epoxy resin having fillers, a molding compound (e.g., an epoxy molding compound or other molding compound), a polyimide, a phenolic compound or material, a material with a silicone dispersed therein, or a combination thereof.

The encapsulant 17 is disposed on the surface 111 of the substrate 11 to cover or encapsulate the electronic components 14c and 14d. In some embodiments, the encapsulant 16 and the encapsulant 17 may include the same material. Alternatively, the encapsulant 16 and the encapsulant 17 may include different materials.

The thermal conductive structure (which can also be referred to as a spacer) 13 is disposed between the surface 101 of the substrate 10 and the electronic component 12. The thermal conductive structure 13 is disposed between the surface 101 of the substrate 10 and the backside surface (e.g., the surface 122) of the electronic component 12. For example, the electronic component 12 has an active surface 121 having input/output (I/O) terminals such as bonding pads 12p1 or other conductive structures configured to electrically connect the electronic component 12 to the substrate 11. The active surface 121 of the electronic component 12 may face away from the thermal conductive structure 13. Alternatively, the active surface 121 of the electronic component 12 may face the thermal conductive structure 13. For example, the semiconductor device package 1 may further include conductive wires such as bonding wires (not illustrated in the figures) electrically connecting the active surface 121 to the substrate 11.

The thermal conductive structure 13 is in contact with the surface 122 of the electronic component 12. The thermal conductive structure 13 is in contact with the surface 101 of the substrate 10. In some embodiments, the thermal conductive structure 13 is in direct contact with the surface 122 of the electronic component 12 without using intervening materials such as a die attaching material or a molding compound. In some embodiments, the thermal conductive structure 13 is in direct contact with the surface 101 of the substrate 10 without using intervening materials such as a die attaching material or a molding compound. In some embodiments, the electronic component 12 may include a via, such as a through silicon via (TSV), and the thermal conductive structure 13 may be in conduction with the TSV. For example, the conductive structure 13 may be in thermal conduction with the TSV. For example, the conductive structure 13 may be in electrical conduction with the TSV. The TSV may be connected between the conductive structure 13 and the substrate 11. The TSV may be an electrical conductive path of the electronic component 12 between the substrate 10 and the substrate 11. The TSV may be connected between the conductive structure 13 and the substrate 11. The TSV may be a thermal conductive path of the electronic component 12 between the substrate 10 and the substrate 11.

In some embodiments, an area of the thermal conductive structure 13 (e.g., an area of a top surface of the thermal conductive structure 13, or of a footprint of the thermal conductive structure 13) may be substantially equal to an area of the electronic component 12 (e.g., an area of the surface 122 of the electronic component 12, or of a footprint of the electronic component 12).

In some embodiments, a material of the thermal conductive structure 13 (that is, a material included in the thermal conductive structure 13) may include, but is not limited to, a metal (e.g., copper or silver), a metal alloy, a thermal interface material, an epoxy resin, or another material with high thermal conductivity. In some embodiments, the thermal conductive structure 13 may be or may include a silver sintering film or a silver paste. In some embodiments, a coefficient of thermal conductivity of the thermal conductive structure 13 is greater than a coefficient of thermal conductivity of the encapsulant 16.

In some comparative implementations, the thermal conductive structure 13 may be omitted, and the backside surface (e.g., the surface 122) of the electronic component 12 is in contact with the encapsulant 16. Since the encapsulant 16 has a relatively lower thermal conductivity, it is difficult to dissipate the heat generated by the electronic component 12. Therefore, the heat would be accumulated between the substrate 10 and the substrate 11, which may cause the electronic component 12 to malfunction. In addition, if the substrate 10 and the substrate 11 are connected without the electronic component 12 being supported by the thermal conductive structure 13 from the surface 122 (such as the operation illustrated in FIG. 4C without the thermal conductive structure 13), the height or distance between the substrate 10 and the substrate 11 may be uncontrolled. For example, the solder balls 15s may flow away during a high-temperature process (e.g., a reflow operation), resulting in uneven joint height. Moreover, warpage (which may be caused from differences in coefficients of thermal expansion (CTE)) may occur if the heat accumulated between the substrate 10 and the substrate 11. The substrate 10 and/or the substrate 11 bending outwardly may cause problems such as non-wetting or insufficient solder. This would adversely affect the electrical performance of the semiconductor device package 1.

As shown in FIG. 1A, the thermal conductive structure 13 is interposed between and in contact with the substrate 10 and the electronic component 12. Heat generated by the electronic component 12 can be quickly and/or efficiently transferred through the thermal conductive structure 13 in a vertical direction Z substantially perpendicular to the surface 101 of the package substrate 10, thus improving heat dissipation efficiency. In some embodiments, the thermal conductivity in the vertical direction Z is greater than (e.g., by a factor of about 1.1 or more, 1.2 or more, 1.3 or more, or greater) the thermal conductivity in one, or both, lateral directions X, Y, which are substantially parallel to the surface 101 of the package substrate 10 (e.g., the surface 101 of the package substrate 10 may be substantially in a plane that extends in the X and Y directions). In some embodiments, the coefficient of thermal conductivity of the thermal conductive structure 13 may be in a range of about 50 W/mK to about 300 W/mK.

Furthermore, after bonding the electronic component 12 to the thermal conductive structure 13 by heat and compression technique(s), the adhesion between the electronic component 12 and the thermal conductive structure 13 can prevent substrate warpage. The height or distance between the substrate 10 and the substrate 11 can be confined to a preferred height or can be controlled to an acceptable value. For example, the height or distance between the substrate 10 and the substrate 11 can be controlled by the thermal conductive structure 13. In such a way, the stated problems can be solved, which can enhance the reliability of the semiconductor device package 1.

In some embodiments, directly contacting the thermal conductive structure 13 with a surface 122 of the electronic component 12 without using intervening materials such as a die attaching material or a molding compound can further help to enhance thermal conductive efficiency of the semiconductor package device 1.

Alternatively, the thermal conductive structure 13 may be connected or attached to the surface 122 of the electronic component 12 through a die attaching layer (e.g., a die attaching film, and/or an adhesive, such as electrically and/or thermally conductive adhesive). In some embodiments, as shown in FIG. 1B, a seed layer 13a may be interposed between and in contact with the thermal conductive structure 13 and the electronic component 12. In some embodiments, the seed layer 13a may include, for example, Ag, Au Ti, Cu, Ni, another metal, or an alloy (such as a TiW). In some embodiments, the seed layer 13a may improve adhesion between the thermal conductive structure 13 and the electronic component 12. In some embodiments, the thermal conductive structure 13 may include Cu (such as a Cu block) and may be connected or attached to the surface 122 by surface mount soldering. In some embodiments, the thermal conductive structure 13 may include Al, Mg, or aluminum-magnesium alloy and may be connected or attached to the surface 122 through thermal grease. In some embodiments, the thermal conductive structure 13 may include a ceramic (such as silicon) and may be connected or attached to the surface 122 through a glue.

Figure 1C:
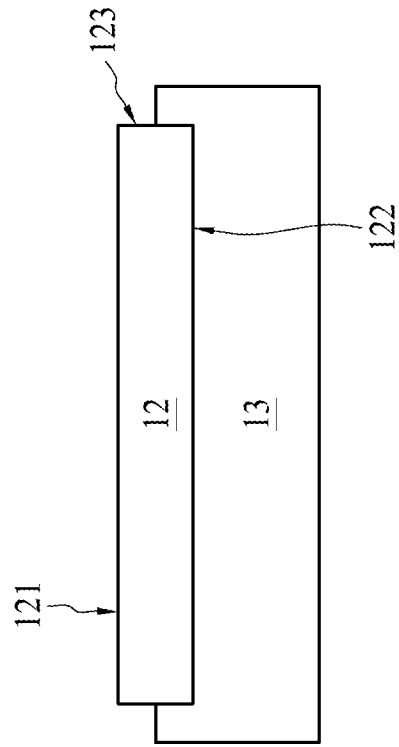
FIG. 1C illustrates a cross-sectional view of a portion of a semiconductor device package in accordance with some embodiments of the present disclosure.

In some embodiments, as shown in FIG. 1C, an area of the thermal conductive structure 13 may be smaller than an area of the electronic component 12. A portion 122a of the surface 122 of the electronic component 12 may be exposed from the thermal conductive structure 13. The portion 122a of the surface 122 may be angled with respect to the lateral surface 123. The portion 122a of the surface 122 may face the substrate 10 as shown in FIG. 1A. Compression force can be applied evenly to the entire area of the thermal conductive structure 13. This can help maintain uniform porosity of the thermal conductive structure 13, and the stress of the thermal conductive structure 13 can be evenly distributed.

Figure 1D:
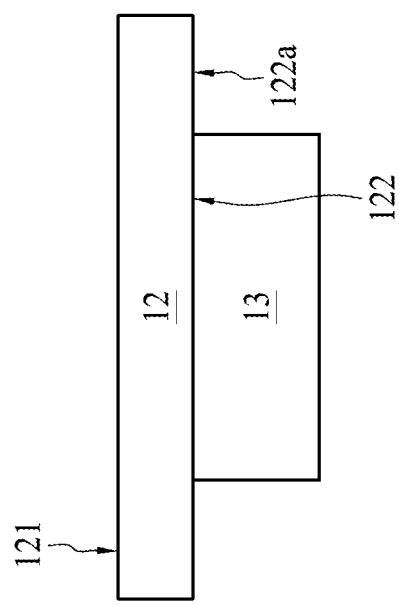
FIG. 1D illustrates a cross-sectional view of a portion of a semiconductor device package in accordance with some embodiments of the present disclosure.

In some other embodiments, as shown in FIG. 1D, an area of the thermal conductive structure 13 may be greater than an area of the electronic component 12. Since compression force are not applied on the entire area of the thermal conductive structure 13, the porosity of the thermal conductive structure 13 may be not uniformed. The surface 122 of the electronic component 12 may be fully covered by the thermal conductive structure 13. The electronic component 12 may be partially embedded in the thermal conductive structure 13. For example, the lateral surface 123 (which may be perpendicular to the surface 122) of the electronic component 12 may be in direct contact with the thermal conductive structure 13. This can help to enhance thermal conductive efficiency in one or both lateral directions X, Y.

Figure 1E:
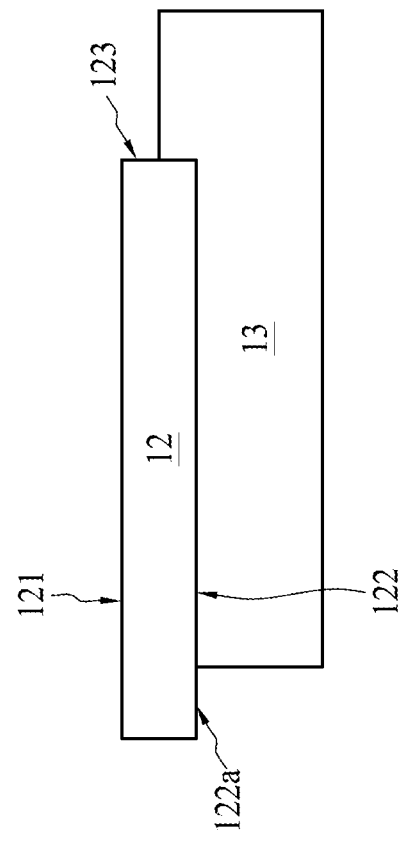
FIG. 1E illustrates a cross-sectional view of a portion of a semiconductor device package in accordance with some embodiments of the present disclosure.

In some other embodiments, as shown in FIG. 1E, a portion 122a of the surface 122 of the electronic component 12 may be exposed from the thermal conductive structure 13 and the lateral surface 123 of the electronic component 12 may be in direct contact with the thermal conductive structure 13.

Figure 1F:
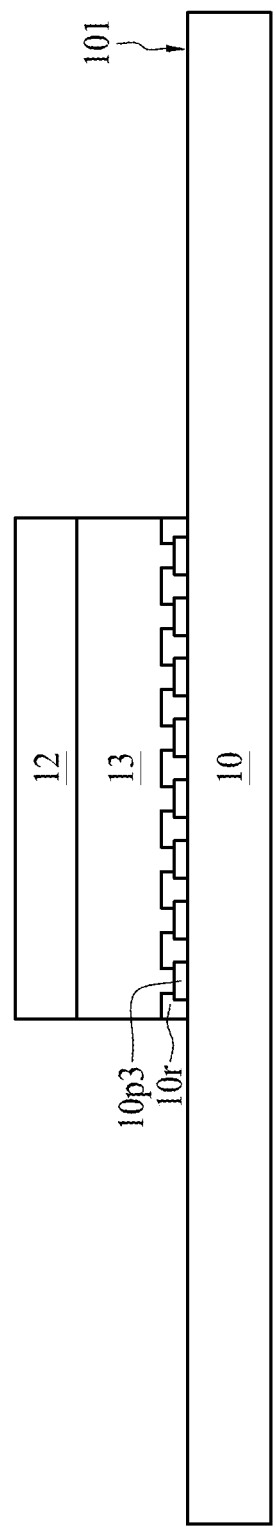
FIG. 1F illustrates a cross-sectional view of a portion of a semiconductor device package in accordance with some embodiments of the present disclosure.

In some embodiments, as shown in FIG. 1F, the substrate 10 may include one or more conductive pads 10p3 in proximity to, adjacent to, or embedded in and exposed at the surface 101 of the substrate 10. The substrate 10 may include solder resists 10r (or solder mask) on the surface 101 of the substrate 10 to fully expose or to expose at least a portion of the conductive pads 10p3 for electrical connections. In some embodiments, the conductive pads 10p3 may be electrically connected to the conductive traces in the substrate 10. This can help to enhance thermal conductive efficiency of the semiconductor package device 1.

Figure 1G:
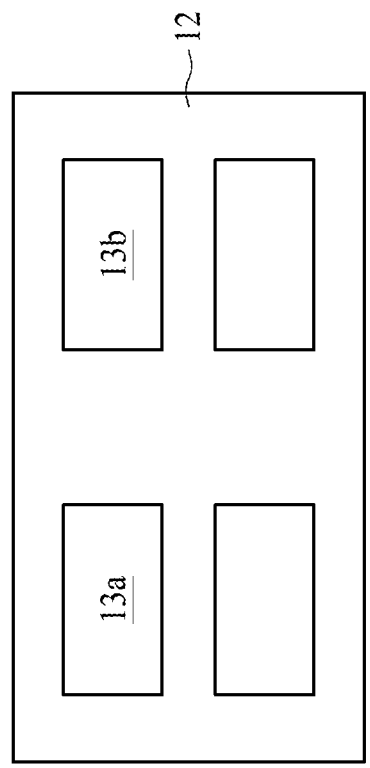
FIG. 1G illustrates a top view of a portion of a semiconductor device package in accordance with some embodiments of the present disclosure.
Figure 1H:
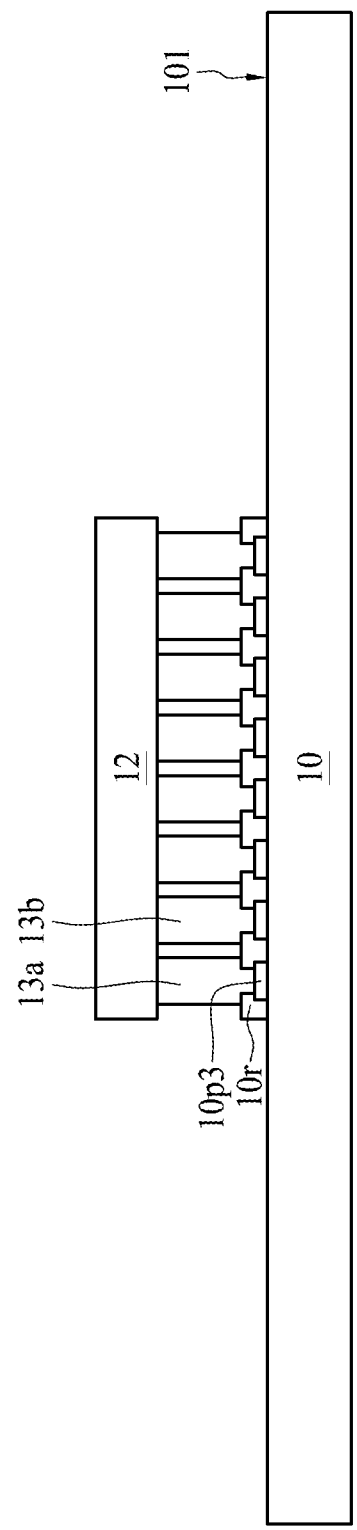
FIG. 1H illustrates a cross-sectional view of a portion of a semiconductor device package in accordance with some embodiments of the present disclosure.

In some embodiments, as shown in FIG. 1G, the thermal conductive structure 13 may include a plurality of portions (such as the portion 13a and the portion 13b) spaced apart from each other. In some embodiments, the spacing between the plurality of portions can help to facilitate the molding operation of the encapsulant 16 (such as the operation in FIG. 4E).

In some embodiments, as shown in FIG. 1F, the portion 13a and the portion 13b can respectively in contact with one or more conductive pads 10p3.

Figure 1I:
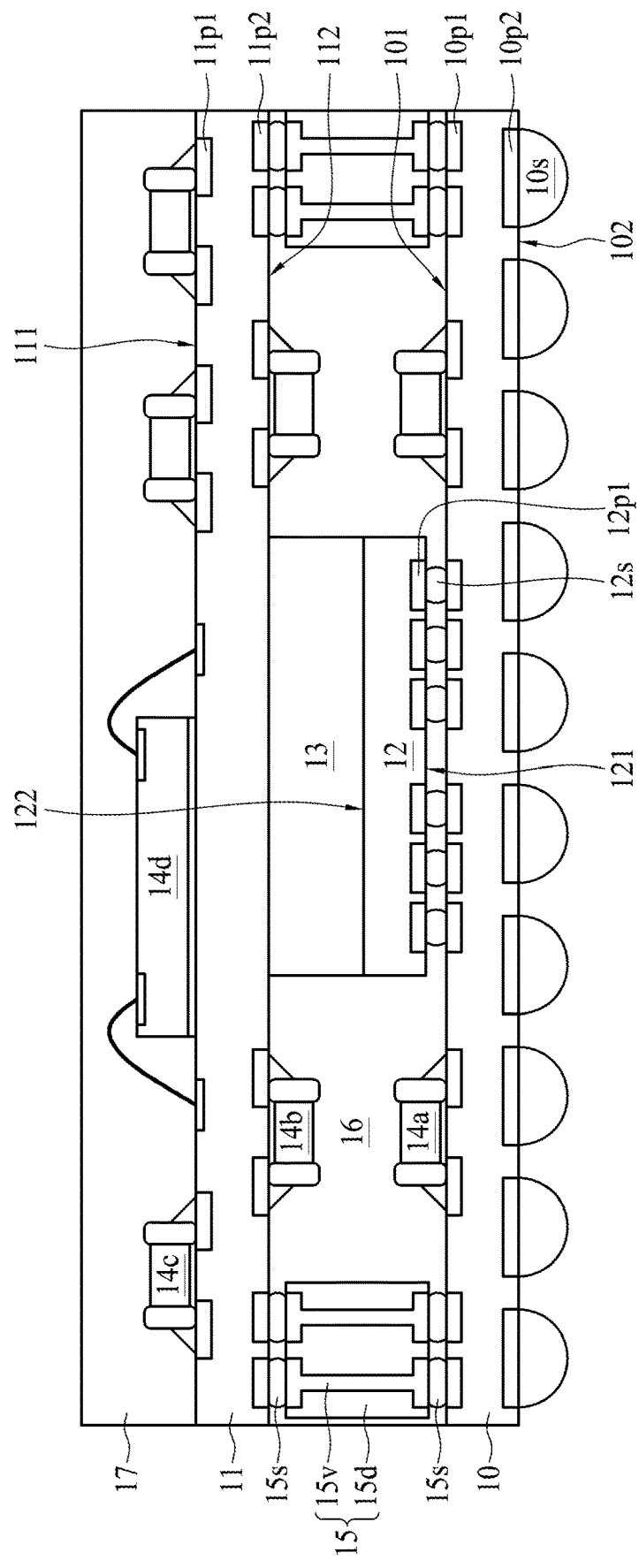
FIG. 1I illustrates a cross-sectional view of a semiconductor device package in accordance with some embodiments of the present disclosure.

FIG. 1I is a cross-sectional view of some embodiments of a semiconductor device package 1' in accordance with a second aspect of the present disclosure. The semiconductor device package 1' is similar to the semiconductor device package 1 in FIG. 1A except that the electronic component 12 is electrically connected to the substrate 10 through solder balls 12s.

Figure 2:
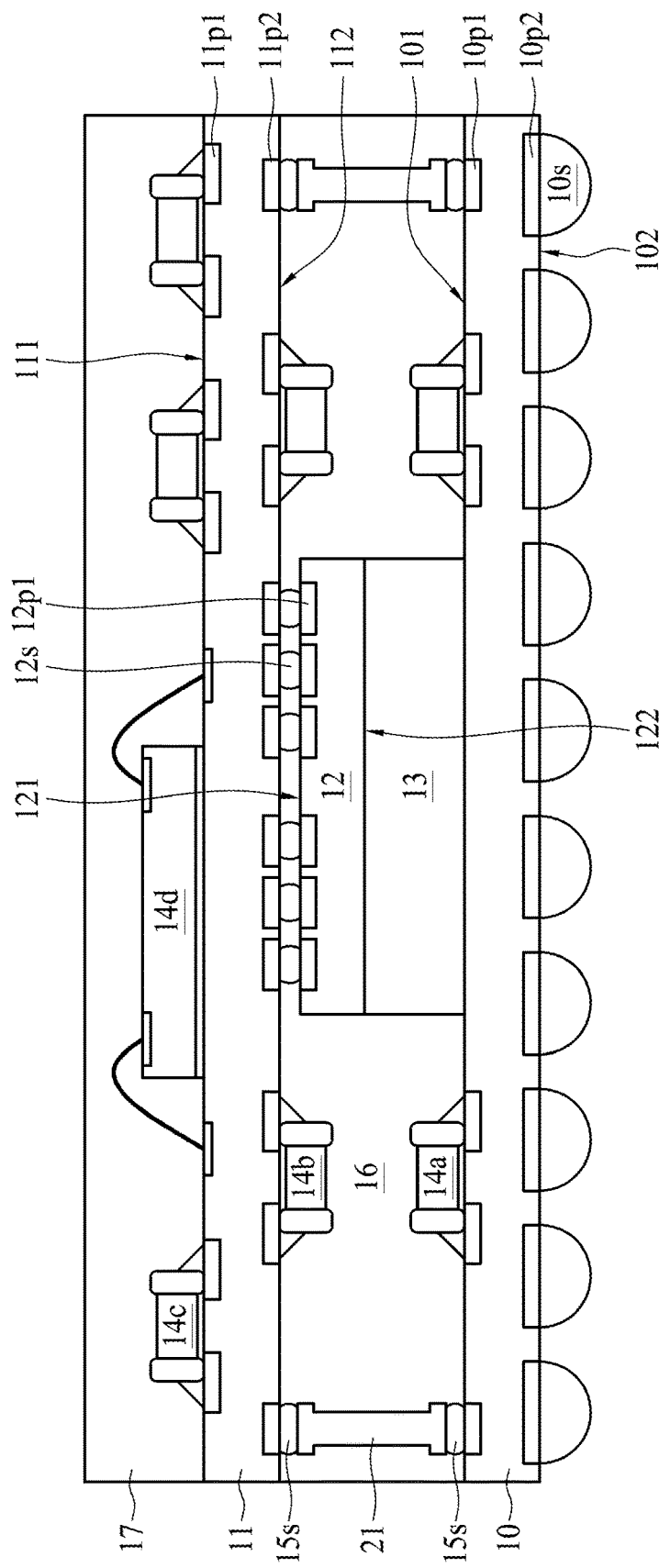
FIG. 2 illustrates a cross-sectional view of a semiconductor device package in accordance with some embodiments of the present disclosure.

FIG. 2 is a cross-sectional view of some embodiments of a semiconductor device package 2 in accordance with a second aspect of the present disclosure. The semiconductor device package 2 is similar to the semiconductor device package 1 in FIG. 1A except that the substrate 10 and the substrate 11 is electrically connected through a copper pillar 21. For example, the current from the substrate 10 may flow to the substrate 11 through the conductive pad 10p1, the solder ball 15s on the conductive pad 10p1, the copper pillar 21, the solder ball 15s on the copper pillar 21, and the conductive pad 11p2.

Figure 3:
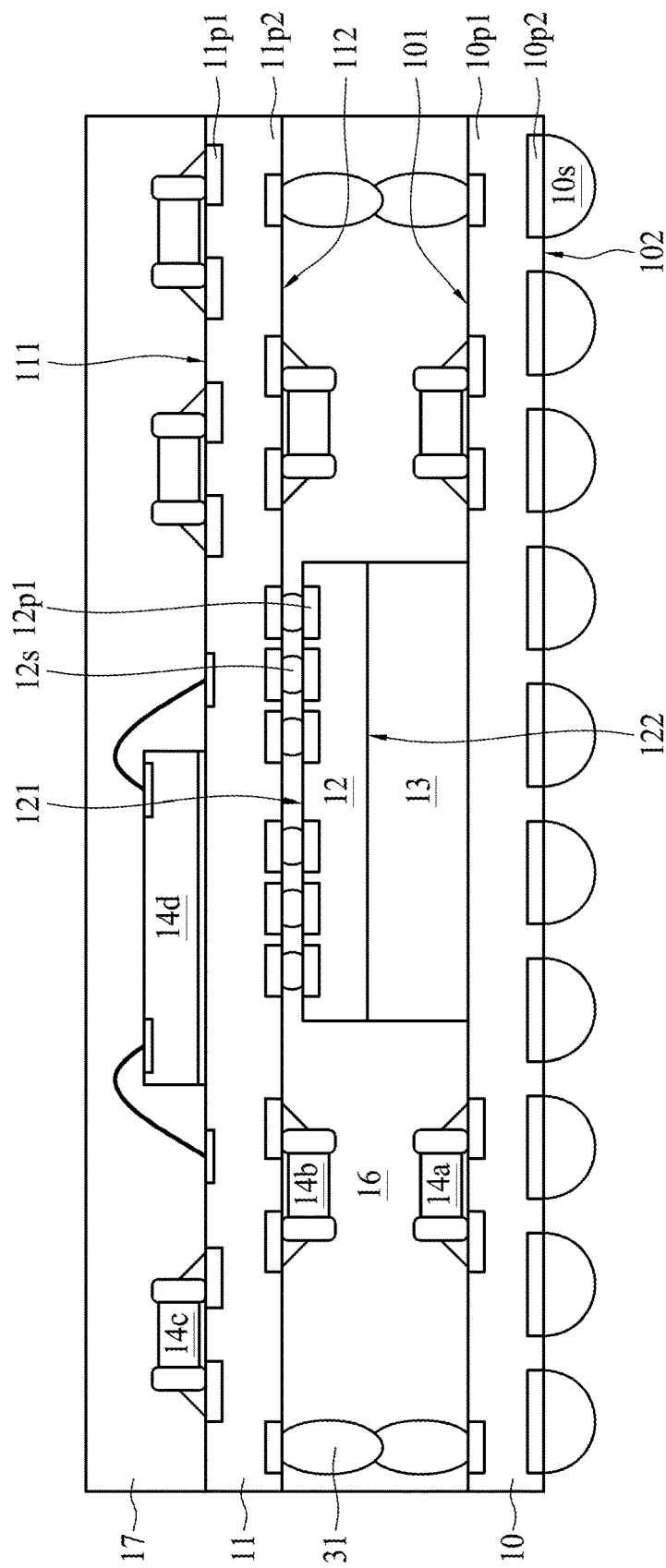
FIG. 3 illustrates a cross-sectional view of a semiconductor device package in accordance with some embodiments of the present disclosure.

FIG. 3 is a cross-sectional view of some embodiments of a semiconductor device package 3 in accordance with a second aspect of the present disclosure. The semiconductor device package 3 is similar to the semiconductor device package 1 in FIG. 1A except that the substrate 10 and the substrate 11 is electrically connected through one or more solder balls 21. For example, the current from the substrate 10 may flow to the substrate 11 through the conductive pad 10p1, the one or more solder balls 21, and the conductive pad 11p2.

Semiconductor device packages provided for by the present disclosure are not limited to the above-described embodiments, and may include other, different embodiments, such as those described below. To simplify the description and for convenient comparison between each of the embodiments of the present disclosure, the same or similar components in each of the following embodiments are marked with the same numerals and are not redundantly described.

FIG. 4A, FIG. 4B, FIG. 4C, FIG. 4D, FIG. 4E, and FIG. 4F illustrate a semiconductor manufacturing method in accordance with some embodiments of the present disclosure. In some embodiments, the method in FIG. 4A, FIG. 4B, FIG. 4C, FIG. 4D, FIG. 4E, and FIG. 4F can be used to manufacture the semiconductor device package 1' in FIG. 1I. Alternatively, the method in FIG. 4A, FIG. 4B, FIG. 4C, FIG. 4D, FIG. 4E, and FIG. 4F can be used to manufacture the semiconductor device packages in FIG. 1A, FIG. 2, FIG. 3, or other semiconductor device packages.

Figure 4A:
FIG. 4A to FIG. 4F illustrate various intermediate stages of a method for manufacturing a semiconductor device package in a cross-sectional perspective, in accordance with some embodiments of the present disclosure.

Referring to FIG. 4A, the substrate 10 is provided. Electronic component 14a is disposed on the surface 101 of the substrate 10 and electrically connected to the substrate 10 through, for example, flip-chip, wire bonding or any other suitable techniques. The interconnection structure 15 is disposed on the surface 101 of the substrate 10 and electrically connected to the substrate 10 through the solder ball 15s.

Figure 4B:
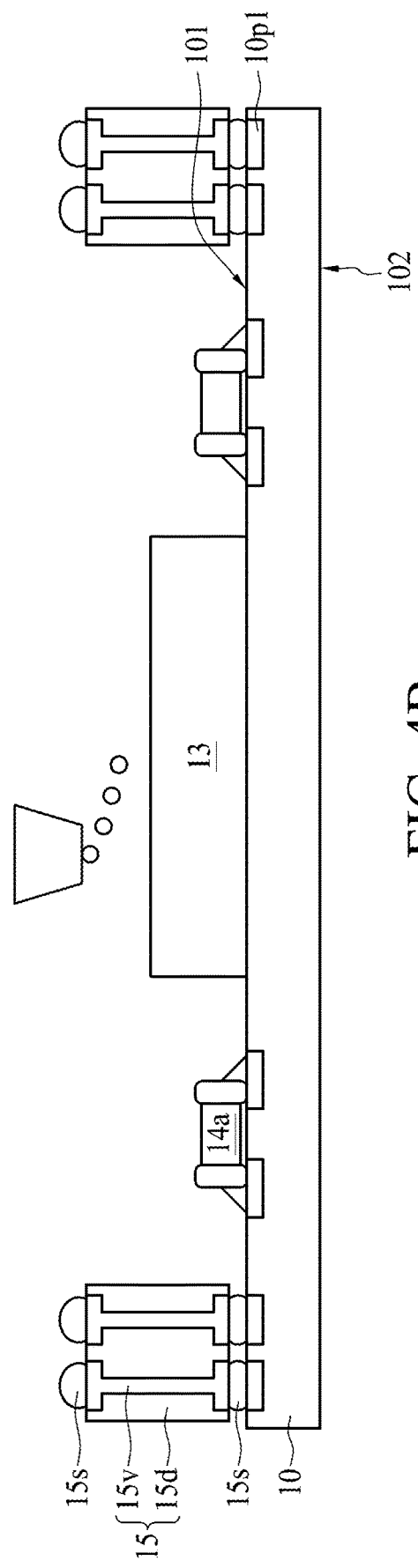

Referring to FIG. 4B, the thermal conductive structure 13 is disposed on the surface 101 of the substrate 10. In some embodiments, the thermal conductive structure 13 may be disposed by, for example, silver sintering or any other suitable techniques.

Figure 4C:
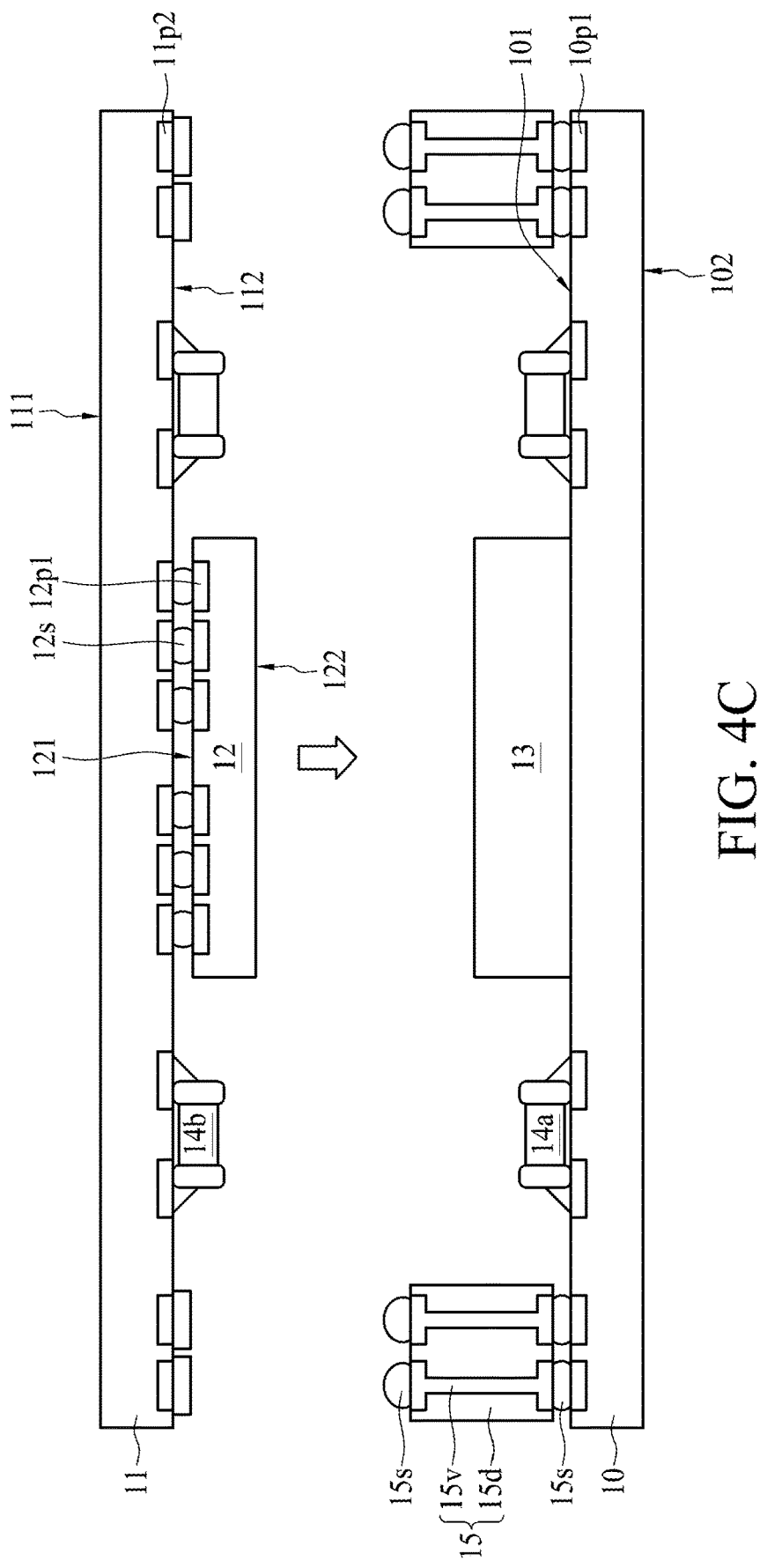

Referring to FIG. 4C, the substrate 11 is provided and then connected to the substrate 10. Electronic components 12 and 14b are disposed on the surface 112 of the substrate 11 and electrically connected to the substrate 11 through, for example, flip-chip, wire bonding or any other suitable techniques. The substrate 10 is connected to the substrate 11 through the interconnection structure 15 and the solder balls 15s. In some embodiments, a soldering material may be pre-formed on the conductive pad 11p2 of the substrate 11. In some embodiments, a seed layer (such as the seed layer 13a in FIG. 1B) may be pre-formed on the electronic component 12. In some embodiments, the electronic component 12 is bonded on the thermal conductive structure 13 by applying heat and compression technique(s) in, for example, a curing operation.

Figure 4D:
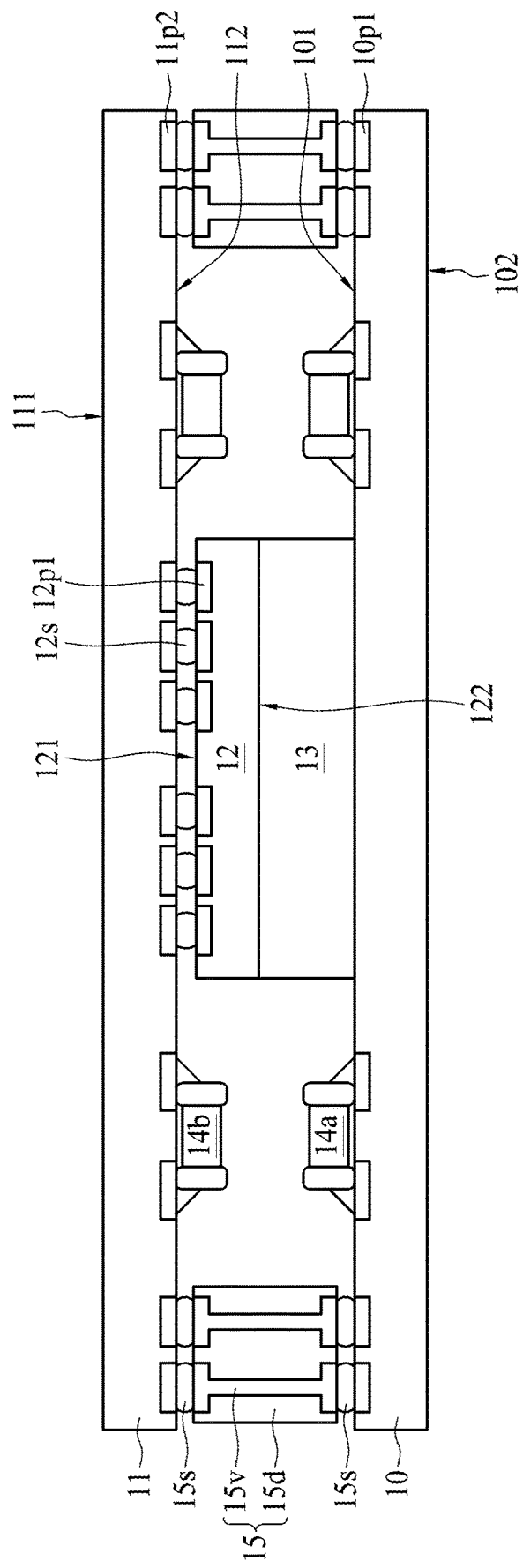

Referring to FIG. 4D, a reflow operation (such as a reflow soldering) can be conducted to solder the solder balls 15s. In some embodiments, the reflow operation in FIG. 4D is conducted after the curing operation in FIG. 4C. In some embodiments, the temperature of the reflow operation in FIG. 4D is greater than the temperature of the curing operation in FIG. 4C.

Figure 4E:
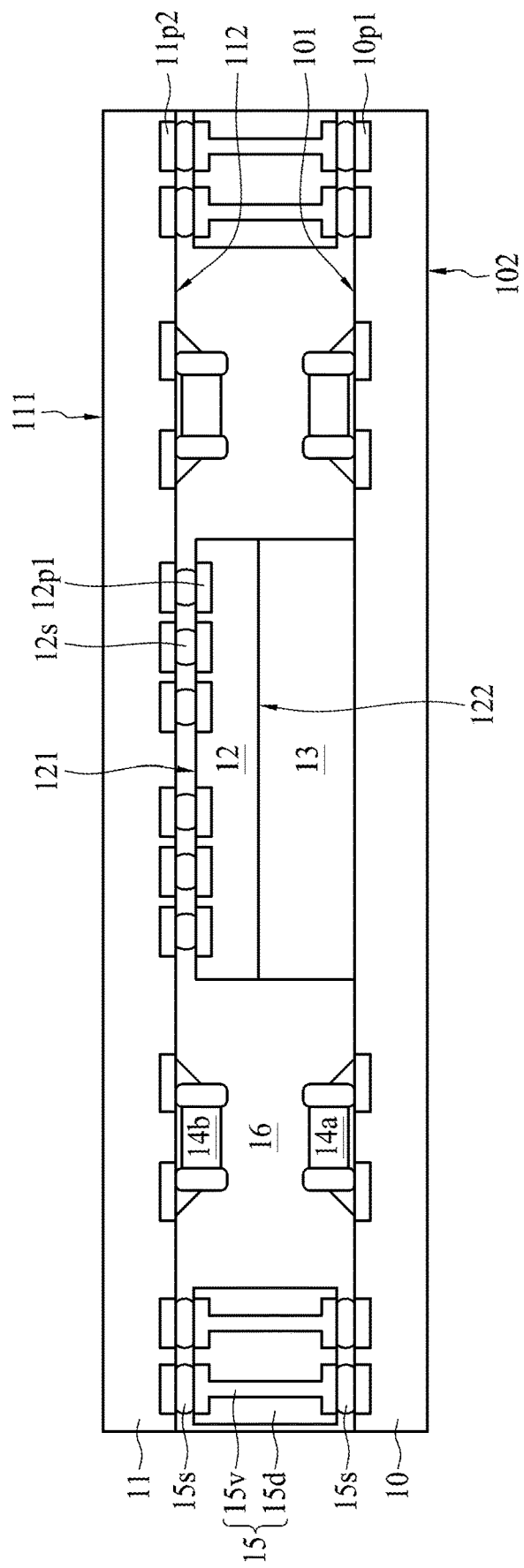

Referring to FIG. 4E, the encapsulant 16 is formed between the substrate 10 and the substrate 20 to cover the electronic components 12, 14a, and 14b and the interconnection structure 15 disposed therebetween. In some embodiments, the encapsulant 16 may be formed by, for example, molding or any other suitable processes. In some embodiments, the encapsulant 16 may be formed after forming the interconnection structure 15 on the substrate 10.

Figure 4F:
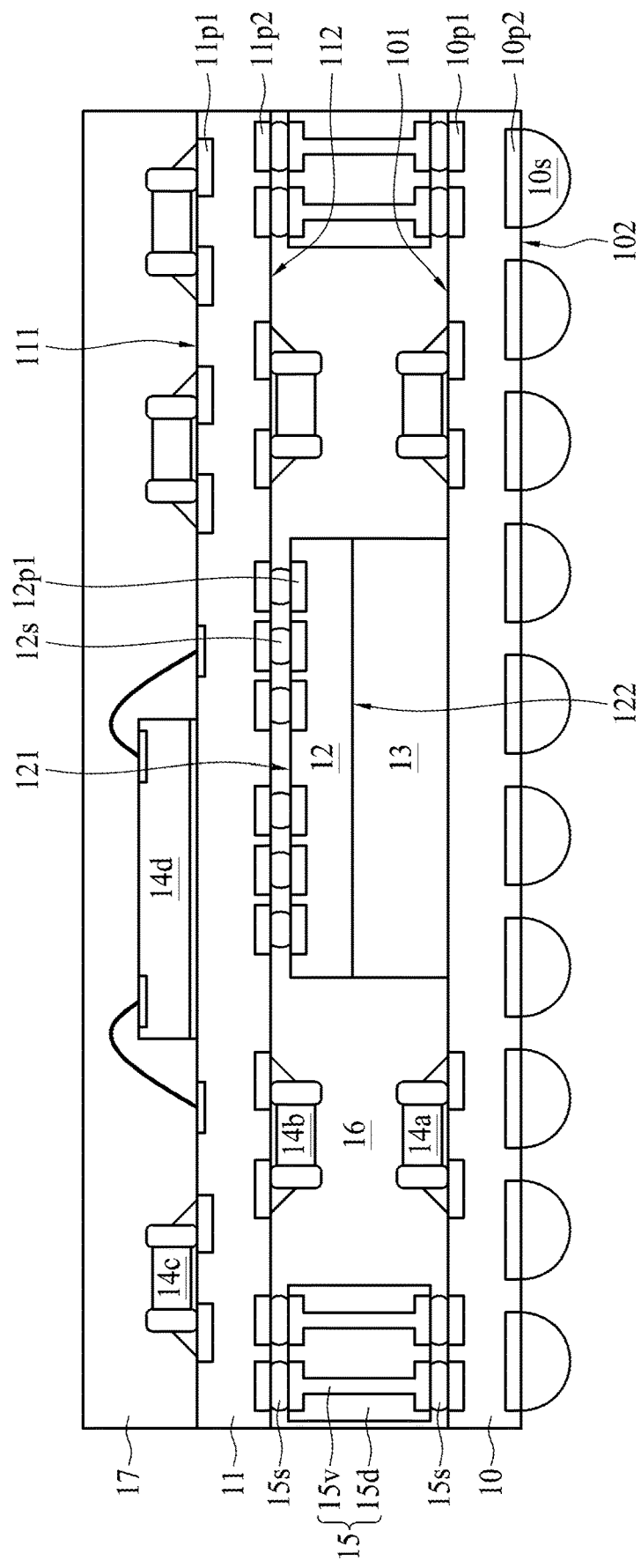

Referring to FIG. 4F, the electronic components 14c and 14d are disposed on the surface 111 of the substrate 11. In some embodiments, the electronic components 14c and 14d may be disposed by, for example, SMT or any other suitable techniques. The encapsulant 17 is formed to cover the electronic components 14c and 14d. In some embodiments, electrical contacts (e.g., solder balls 10s) may be disposed on a surface 102 of the substrate 10 to form the semiconductor device package 1 as shown in FIG. 1A.

As used herein, the singular terms "a," "an," and "the" may include a plurality of referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations per-formed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
   a first substrate;
   a second substrate disposed over the first substrate;
   an electronic component disposed between the first substrate and the second substrate;
   a spacer disposed between the first substrate and the electronic component, wherein the spacer is configured to control a distance between the first substrate and the second substrate through the electronic component; and
   a supporting element disposed on the first substrate and configured to support the second substrate,
   wherein the spacer directly contacts the electronic component and exposes a lateral surface of the electronic component, and
   wherein the spacer exposes a surface of the electronic component, and the surface of the electronic component is angled with respect to the lateral surface of the electronic component and facing the first substrate.

2. The semiconductor package device of claim 1, wherein the electronic component is electrically connected with the second substrate and physically disconnected from the first substrate.

3. The semiconductor package device of claim 2, wherein the spacer is configured to transfer heat between the electronic component and the first substrate.

4. The semiconductor package device of claim 1, wherein the spacer is configured to support the first substrate.

5. The semiconductor package device of claim 1, wherein the supporting element electrically connects the first substrate to the second substrate.

6. The semiconductor device package of claim 5, wherein the supporting element connects the first substrate to the second substrate through a soldering material.

7. The semiconductor device package of claim 2, wherein the electronic component is electrically connected to the second substrate through a first connection, and the supporting element comprises a second connection, and a dimension of the second connection is greater than a dimension of the first connection.

8. The semiconductor device package of claim 1, further comprising:
   an encapsulant disposed between the first substrate and the second substrate and covering the electronic component, the supporting element and the spacer.

9. The semiconductor device package of claim 8, wherein a thermal conductivity of the spacer is higher than a thermal conductivity of the encapsulant.

10. The semiconductor device package of claim 1, wherein the first substrate further comprises:
    a conductive pad disposed adjacent to a surface of the first substrate facing the second substrate, wherein the conductive pad is in conduction with the spacer.

11. The semiconductor device package of claim 10, wherein the first substrate further comprises a conductive trace embedded within the first substrate and electrically connected to the conductive pad.

12. A semiconductor device package, comprising:
    a first substrate;
    a second substrate disposed over the first substrate;
    an electronic component disposed between the first substrate and the second substrate;
    a spacer disposed between the first substrate and the electronic component, wherein the spacer is configured to control a distance between the first substrate and the second substrate through the electronic component; and
    a supporting element disposed on the first substrate and configured to support the second substrate,
    wherein the spacer has a first portion and a second portion spaced apart from the first portion of the spacer, and the semiconductor device package further comprises:
    a first conductive pad between the first portion of the spacer and the electronic component; and
    a second conductive pad between the second portion of the spacer and the electronic component.

13. The semiconductor device package of claim 12, further comprising:
    a protective element disposed between the first portion and the second portion of the spacer.

14. The semiconductor device package of claim 10, wherein the first substrate further comprises a solder resist disposed adjacent to the surface of the first substrate, and wherein the solder resist comprises an opening exposing the conductive pad and accommodating a part of the spacer.

* * * * *